US010075202B2

(12) United States Patent
Wu et al.

(10) Patent No.: US 10,075,202 B2
(45) Date of Patent: *Sep. 11, 2018

(54) DETECTION PATH DESIGN FOR COMMUNICATION SYSTEMS

(71) Applicant: MEDIATEK INC., Hsinchu (TW)

(72) Inventors: Ming-Chou Wu, Miaoli County (TW); Dimitris Nalbantis, Kent (GB); Qiang Zhou, San Jose, CA (US); Bernard Mark Tenbroek, Kent (GB); Ting-Hsuan Kuo, Changhua County (TW)

(73) Assignee: MEDIATEK INC., HsinChu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/662,728

(22) Filed: Jul. 28, 2017

(65) Prior Publication Data
US 2017/0331503 A1    Nov. 16, 2017

Related U.S. Application Data

(63) Continuation of application No. 15/002,089, filed on Jan. 20, 2016.
(Continued)

(51) Int. Cl.
*H04L 25/03*     (2006.01)
*H04B 1/04*      (2006.01)
*H04B 17/19*     (2015.01)
*H04B 17/12*     (2015.01)
*H04B 17/10*     (2015.01)
*G01R 27/06*     (2006.01)
*H04L 27/12*     (2006.01)

(52) U.S. Cl.
CPC ........... *H04B 1/0475* (2013.01); *G01R 27/06* (2013.01); *H04B 1/0458* (2013.01);
(Continued)

(58) Field of Classification Search
CPC ...... H04B 1/71; H04B 17/103; H04B 1/0458; H04B 17/14; H04B 17/19; H04B 1/0475;
(Continued)

(56) References Cited

U.S. PATENT DOCUMENTS 8,644,776 B1    2/2014  Nobbe et al. ............. 455/115.1
9,654,059 B2 *  5/2017  Kuo .......................... H03F 1/56
(Continued)

OTHER PUBLICATIONS

EPO, Search Report for the EP patent application 16152203.2 dated Jun. 20, 2016 (6 pages).

*Primary Examiner* — Khanh C Tran
(74) *Attorney, Agent, or Firm* — Imperium Patent Works; Zheng Jin; Helen Mao

(57) ABSTRACT

Methods and apparatus are provided for detection path design for reflection coefficient estimation. In one novel aspect, a hardware-based phase estimator estimates a phase shift between the forward path signal and the reverse path signal. In one embodiment, a data selector is used to pass only signals above a magnitude threshold. In another embodiment, a modified phase unwrap algorithm stores an unwrapping correction for subsequent samples and updates the stored unwrapping correction upon processing of each sample processed. In another novel aspect, mixed hardware and software solutions are used. In one embodiment, the reference signal and the detection signals are matched such that the modulation signal interference is removed. In some embodiments, one or two power detectors and a cross-correlator are used. In yet another embodiment, two detection measurement paths are used to obtain the reflection coefficient. In one embodiment, fractional timing offset is estimated to obtain the reflection coefficient.

12 Claims, 6 Drawing Sheets

Related U.S. Application Data

(60) Provisional application No. 62/105,835, filed on Jan. 21, 2015.

(52) U.S. Cl.
CPC .......... *H04B 17/103* (2015.01); *H04B 17/12* (2015.01); *H04B 17/19* (2015.01); *H04L 27/12* (2013.01)

(58) Field of Classification Search
CPC ........ H04B 1/18; G01R 27/06; G01R 35/005; H01Q 5/335; H03H 7/38; H03H 7/40
See application file for complete search history.

(56) References Cited

U.S. PATENT DOCUMENTS

| | | | |
|---|---|---|---|
| 2002/0159537 A1 | 10/2002 | Crilly, Jr. | 375/267 |
| 2013/0094556 A1 | 4/2013 | Itkin | 375/224 |
| 2013/0106440 A1 | 5/2013 | Brunner | 324/629 |
| 2013/0107914 A1 | 5/2013 | Park et al. | 375/219 |
| 2013/0245976 A1 | 9/2013 | Hind | 702/65 |
| 2014/0327594 A1* | 11/2014 | Zhang | H03H 7/40 343/861 |
| 2016/0020814 A1* | 1/2016 | Wang | H03H 7/38 455/77 |
| 2016/0097833 A1* | 4/2016 | Han | G01R 29/0878 343/702 |

\* cited by examiner

DETECTION PATH DESIGN FOR COMMUNICATION SYSTEMS

CROSS REFERENCE TO RELATED APPLICATIONS

This application is a continuation, and claims priority under 35 U.S.C. § 120 from nonprovisional U.S. patent application Ser. No. 15/002,089, entitled "DETECTION PATH DESIGN FOR COMMUNICATION SYSTEMS", filed on Jan. 2, 2016, the subject matter of which is incorporated herein by reference. Application Ser. No. 15/002,089, in turn, claims priority under 35 U.S.C. § 119 from U.S. Provisional Application No. 62/105,835, entitled, "DETECTION PATH DESIGN FOR COMMUNICATION SYSTEMS" filed on Jan. 21, 2015; the subject matter of which is incorporated herein by reference.

TECHNICAL FIELD

The disclosed embodiments relate generally to wireless communication, and, more particularly, to detection path design for communication systems.

BACKGROUND

The wireless communications industry has grown exponentially in recent years. Improving the efficiency of the wireless system is essential to meet the growing the demand. In any wireless communications system, the radio frequency (RF) transmitter plays an important role. Antenna impedance tuning is essential for improving the efficiency of the RF transmission. The maximum power-transfer theorem says that to transfer the maximum amount of power from a source to a load, the load impedance should match the source impedance. Estimation of an antenna load for antenna impedance tuning requires the estimation of the complex reflection coefficient, Gamma, in the input of the matching network. Gamma is defined as the ratio between the reflected voltage wave in the forward path and the incident voltage wave in the reverse path. The Gamma is a parameter that describes how much of the electromagnetic wave is reflected by an impedance discontinuity in the transmission medium. The reflection coefficient, Gamma, is determined by the impedance of the load and the impedance towards the source. The reflection coefficient is a complex number with a magnitude and a phase. Currently, the estimation of Gamma focuses on the magnitude part only.

Improvements and enhancements are needed for reflection coefficient estimation that handles the magnitude and the phase part.

SUMMARY

Methods and apparatus are provided for detection path design for reflection coefficient estimation.

In one novel aspect, a hardware-based phase estimator estimates a phase shift between the forward path signal and the reverse path signal. The phase estimator comprises a first arctan estimator, a second arctan estimator, and a phase-estimator controller. The first arctan estimator calculates a reference-signal phase shift and the second arctan estimator alternatively calculates one of detection-path phase shifts that include a forward path phase shift and a reverse path phase shift. The reflection-coefficient phase shift is generated based on a forward-to-reference phase and a reverse-to-reference phase. In one embodiment, the phase estimator further comprises a data selector that passes only signals above a magnitude threshold. The magnitude threshold is programmable. In another embodiment, the phase estimator further comprises a phase-average calculator that produces a running average instantaneous phase estimations and a phase store unit that stores the estimated phase shift for the forward path and the reverse path. In yet another embodiment, the phase estimator further comprises a phase unwrap unit that executes a phase unwrap algorithm to perform a phase unwrap of the forward and reverse phase shifts on-the-fly such that the phase wrap errors introduced in the phase-average calculator are prevented. The phase unwrap algorithm stores an unwrapping correction for subsequent samples and updates the stored unwrapping correction upon processing of each sample processed.

In another novel aspect, mixed hardware and software solutions are used. The hardware and software mixed solution offers more flexibility and handles modulation signals better with better strategies of alignment. In one embodiment, the apparatus obtains a reference signal on-the-fly, wherein the reference signal is a baseband digital signal of the transmitted wireless signal using a modulation signal specified by the wireless system. The apparatus also obtains detection signals on-the-fly through a coupler, wherein the detection signal comprising a forward signal and a reverse signal. The reference signal and the detection signal are matched such that the transmitting signal is removed. The reflection coefficient is obtained based on the matching reference signal and detection signals, wherein the reflection coefficient includes a magnitude coefficient and a phase coefficient.

In one embodiment, two power detectors and a cross-correlator are used. The phase coefficient is obtained based on a cross-correlation of the forward signal and the reference signal, and a cross-correlation of the reverse signal and the reference signal. The magnitude coefficient is obtained based on a detection signal power for reverse coupling gain, a reference signal power for reverse coupling gain, a detection signal power for forward coupling gain, and a reference signal power for forward coupling gain.

In another embodiment, one power detector and a cross-correlator are used. The reflection coefficient is obtained based on a cross-correlation of the reverse signal and the reference signal, a reference signal power for forward coupling gain, a cross-correlation of the forward signal and the reference signal, and a reference signal power for reverse coupling gain.

In yet another embodiment, two detection measurement paths are used to obtain the reflection coefficient. A power magnitude for the forward signal is obtained. A cross-correlation of the reverse signal and the forward signal is obtained, wherein the forward signal path and the reverse signal path have the same response. The reflection coefficient is obtained based on the power magnitude for the forward signal and the cross-correlation of the reverse signal and the forward signal.

In one embodiment, the fractional timing offset is estimated to obtain the reflection coefficient. A forward path gain and a reverse path gain with a number of sampling greater than a sampling threshold are obtained. The fraction timing offset is estimated based on a known timing interpolation function such that the forward cross-correlation is derived. The reflection coefficient is obtained based on the forward cross-correlation $CR_{for}$ and the reverse cross-correlation $CR_{rev}$.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

To estimate the reflection coefficient, Gamma, the measurements need to be done in both the forward and reverse path. The forward path and the reverse path cannot be measured at the same time. Therefore, a standard reference signal is needed for proper alignment. In one novel aspect, the reference signal is a modulation signal of transmitted signal obtained on the fly. An on-the-fly operation refers to performing the detection to the communication signal without hindering, interrupting, or stopping the normal operation of the transceiver of the transceiver of the apparatus. The estimation of both the magnitude and phase parts of the reflection coefficient using any modulation signal as the reference signal can be achieved in two strategies. The first is to implement the function using pure hardware implementation. The second is to implement the function in the mixed use of the hardware and the software solutions.

Figure 1:
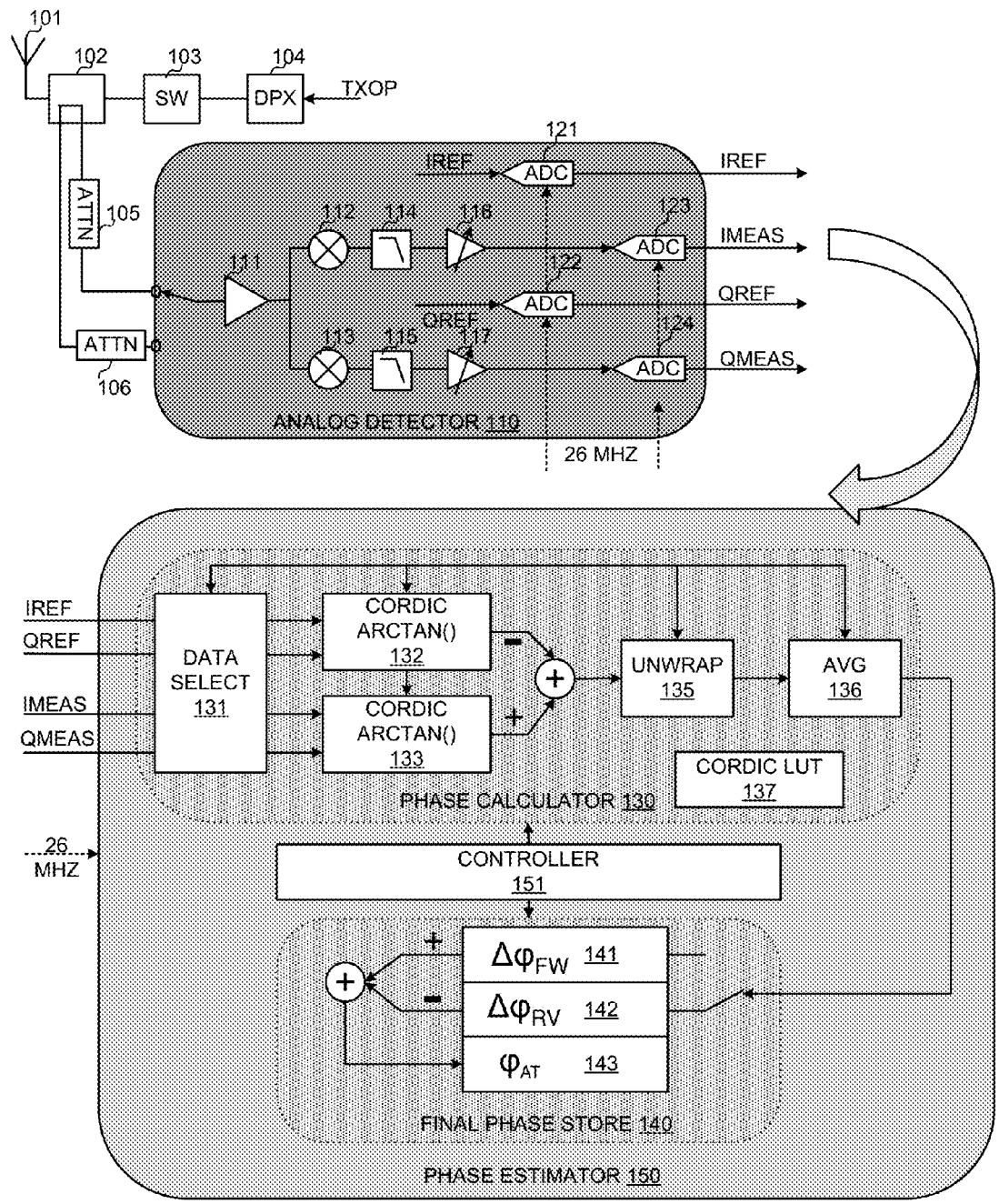
FIG. 1 is an exemplary block diagram of the reflection-coefficient phase estimation using pure hardware approach in accordance to embodiments of the current invention.

FIG. 1 is an exemplary block diagram of an apparatus with the reflection-coefficient phase estimation using pure hardware approach in accordance to embodiments of the current invention. The apparatus has an antenna 101, a coupler 102, an antenna switch 103, and a duplexer 104. The apparatus also includes an analog detector 110 and a phase estimator 150. Antenna 101 receives signals from the transmission path and transmits the RF signal. Coupler 102 is connected to a switch that switches between the forward path and the reverse path. Duplexer 104 allows the relatively powerful transmitting signal to be provided to the antenna while simultaneously allowing the significantly weaker receiving signal to be routed towards a receive circuit. The signal of the forward path and the reverse path passes to analog detector 110 through the switch.

The measured signal is amplitude adjusted by an attenuator 105 for the reverse path and attenuator 106 for the forward path. The signal is then passed to a low noise amplifier (LNA) 111. The signal is further IQ demodulated by a quadrature demodulator 112 and 113, filtered by low pass filters 114 and 115 (LPF), amplified by amplifier 116 and 117, and converted to the digital domain using complimentary I/Q ADCs 123 and 124 running at a sampling rate of 26 MHz for LTE signal, or 13 MHz for WCDMA signal, for example. Different sampling rate can be used depending the system and other conditions of the system. The ADCs 123 and 124 outputs respective digital quadrature components $I_{MEAS}/Q_{MEAS}$ for the measured signal in the forward path and the reverse path, respectively. In one novel aspect, analog detector 110 also has a second signal-processing path generating the digital reference signal $I_{REF}/Q_{REF}$ (e.g. the modulation signal of transmitted signal obtained on the fly).

In one novel aspect, outputs $I_{MEAS}/Q_{MEAS}$ and $I_{REF}/Q_{REF}$ are passed to phase estimator 150 to measure the phase shift of the reflection coefficient. In one embodiment, the accuracy of the phase shift measurement is +/− one degree with 10-65 μsec measurement duration. The measurement duration depends on the operation mode of system, such as WCDMA and LTE. In one embodiment, the phase estimation is implemented in pure hardware as shown in FIG. 1. Phase estimator 150 includes a phase calculator 130, a final phase store 140, and a controller 151. Phase estimator 150 receives $I_{MEAS}/Q_{MEAS}$ from the forward path and the reverse path. Phase estimator 150 also receives $I_{REF}/Q_{REF}$ of the reference signal. Phase calculator 130 takes the $I_{MEAS}/Q_{MEAS}$ and $I_{REF}/Q_{REF}$ inputs and generates phase shift for the forward and the reverse path. Phase store 140 stores the estimated phase shift for the forward and the reverse path. It also generates the phase difference between the forward path and the reverse path. Controller 151 performs basic sequencing logic for phase estimator 150.

In one embodiment, phase calculator 130 includes a data selector 131, a CORDIC arctan( ) 132, CORDIC arctan( ) 133, a unwrap unit 135, an average unit 136, and a CORDIC lookup table (LUT) 137. Data selector 131 filters out unwanted small samples. Data selector 131 passes only signals above a given magnitude in order to stop sampled signals close to zero crossings being passed to the CORDIC engines and degrading the result accuracy. Data selector 131 also activates/deactivates the subsequent processing units dynamically to eliminate errors in the calculation of the phase average.

In one embodiment, the threshold is programmable for extra flexibility. CORDIC arctan( ) 132 and CORDIC arctan( ) 133 produce instantaneous phase estimate in the range 0° to 360°. The arctan( ) unit is implemented as a 10-bit pipeline with hardwired LUT contents. CORDIC arctan( ) 132 receives $I_{REF}/Q_{REF}$ and generates phase shift for the reference signal. CORDIC arctan( ) 133 receives $I_{MEAS}/Q_{MEAS}$ and generates phase shift for the measured signals including the forward path signal and reverse path signal. The difference of the measured phase shifts for the measured signal and reference signal is calculated. The phase difference is passed to unwrap unit 135.

In one embodiment, unwrap unit 135 implements a customized/modified phase unwrap algorithm that performs phase unwrapping of the calculated phase shift on-the-fly to prevent the phase difference calculation from introducing phase wrap errors in the average calculation. Phase average unit 136 produces a running average of the instantaneous phase estimate to eliminate random noise errors. Phase average unit 136 uses adders and shifters to avoid area consuming divider hardware.

Figure 2:
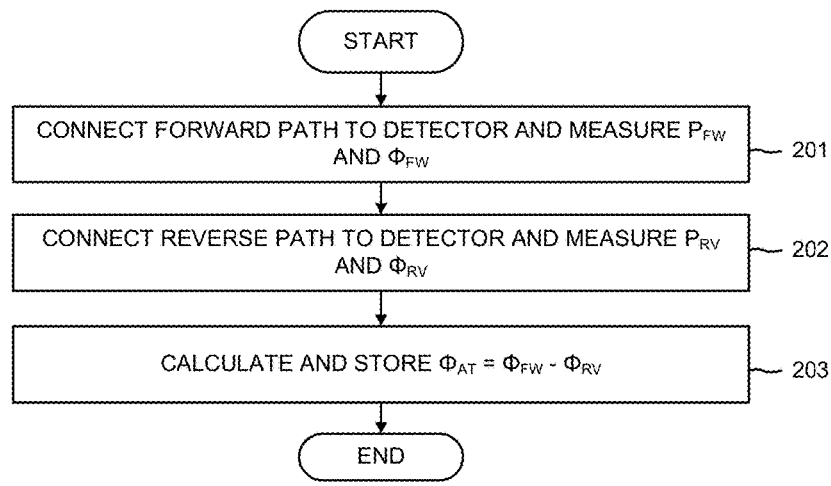
FIG. 2 illustrates an exemplary flow chart of a logic sequence for the phase estimator in accordance with embodiments of the current invention.
Figure 3:
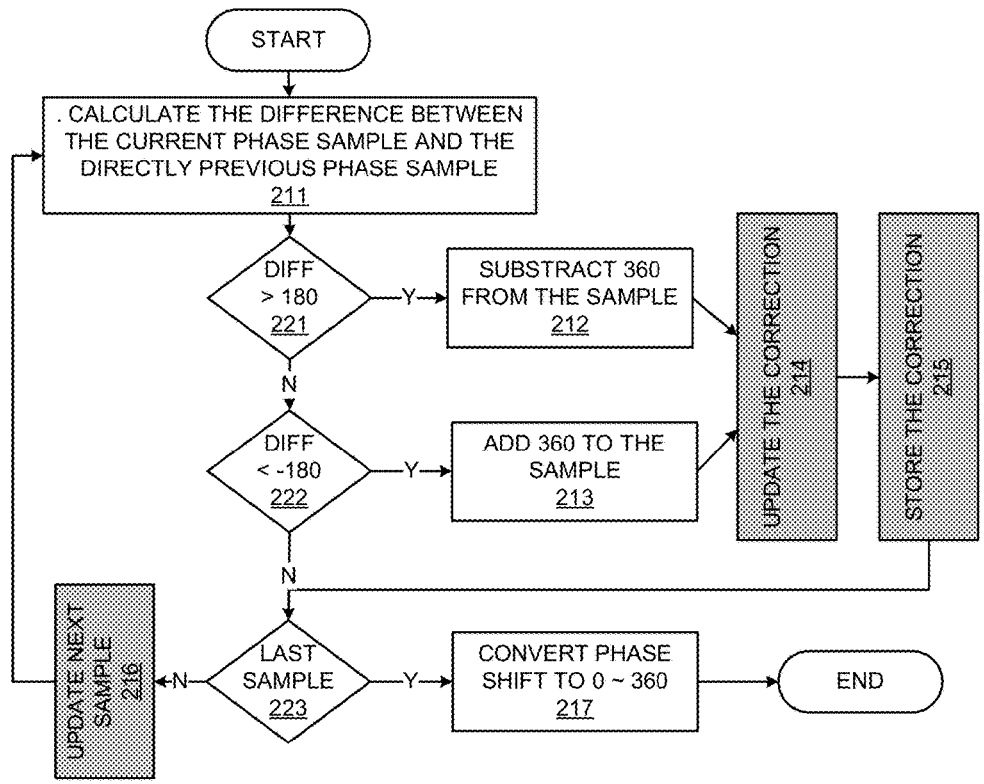
FIG. 3 illustrates an exemplary flow chart of a modified unwrapping algorithm in accordance with embodiments of the current invention.

Phase estimator 150 includes controller 151 that executes and controls logic sequence for the phase estimation. Phase estimator 150 also uses modified algorithms for unwrapping. FIGS. 2 and 3 illustrate these functions.

FIG. 2 illustrates an exemplary flow chart of a logic sequence for the phase estimator in accordance with embodiments of the current invention. At step 201, the apparatus connects the forward path to the detector and measures power of the forward path signal, $P_{FW}$, and the phase of the forward path, $\varphi_{FW}$. With reference to FIG. 1, the switch couples to the attenuator 106 so that the forward path signal is connected to the detector 110. Then $I_{MEAS}/Q_{MEAS}$ of the forward path and $I_{REF}/Q_{REF}$ of the reference signal are measured by the detector 110. $I_{MEAS}/Q_{MEAS}$ of the forward path and $I_{REF}/Q_{REF}$ of the reference signal are further processed by the phase calculator 130, and the phase average unit 136 of the phase calculator 130 outputs the measured phase of the forward path, $\varphi_{FW}$, to the phase store 140. At step 202, the apparatus connects the reverse path to the detector and measures the power of the reverse path signal, $P_{RV}$, and the phase of the reverse path signal, $\varphi_{RV}$. With reference to FIG. 1, the switch couples to the attenuator 105 so that the reverse path signal is connected to the detector 110. Then $I_{MEAS}/Q_{MEAS}$ of the reverse path and $I_{REF}/Q_{REF}$ of the reference signal are measured by the detector 110. $I_{MEAS}/Q_{MEAS}$ of the reverse path and $I_{REF}/Q_{REF}$ of the reference signal are further processed by the phase calculator 130, and the phase average unit 136 of the phase calculator 130 outputs the measured phase of the reverse path, $\varphi_{RV}$, to the phase store 140. At step 203, the apparatus calculates and stores the phase difference between the forward path and the reverse path, $\varphi_{AT}$, where $\varphi_{AT}=\varphi_{FW}-\varphi_{RV}$. The phase estimation $\varphi_{AT}$ of the reflection coefficient using modulation signal as the reference signal is then obtained.

FIG. 3 illustrates an exemplary flow chart of a modified unwrapping algorithm in accordance with embodiments of the current invention. The standard unwrapping algorithm updates all subsequent samples upon performing unwrapping for the current sample. The main issue is that the algorithm needs to have all the samples of the sequence in order to apply the unwrapping correction for each sample position to the current sample and all subsequent samples. For a real-time implementation of the algorithm where samples are obtained and dynamically processed, the basic unwrapping algorithm needed to be modified so that the unwrapping correction for subsequent samples is stored. For each sample processed, the currently stored correction is updated to include any possible correction for the new sample. At the end of the unwrapping algorithm, a mod (n, 360) function is implemented to convert the calculated phase shift in the 0° to 360° range. At step 211, the apparatus calculates the difference between the current phase sample and the directly previous phase sample. At step 221, the apparatus checks whether the difference between the two is larger than 180°. If step 221 determines yes, the apparatus moves to step 212 and subtracts 360° from this sample. The apparatus subsequently updates the correction value at step 214 and stores the correction value at step 215. If step 221 determines no, the apparatus moves to step 222. At step 222, the apparatus determines whether the difference between the two is smaller than −180°. If step 222 determines yes, the apparatus moves to step 213 and adds 360° to this sample. The apparatus subsequently updates the correction value at step 214 and stores the correction value at step 215. If step 222 determines no, the apparatus moves to step 223 and determines if this is the last sample. If step 223 determines no, the apparatus obtains the next sample and updates the next sample with the stored correction value at step 216. Subsequently, the apparatus moves back to step 211. If step 223 determines yes, the apparatus moves to step 217. At step 217, the apparatus converts the phase shift to between 0° and 360° and ends the procedure.

In other novel aspects, mixed hardware and software solutions are used. The hardware and software mixed solution is cost effective, fits in the case when the transmitter baseband and the tuner controller reside in the same chip, offers more flexibility, and handles modulation signals better with better strategies of alignment.

Figure 4:
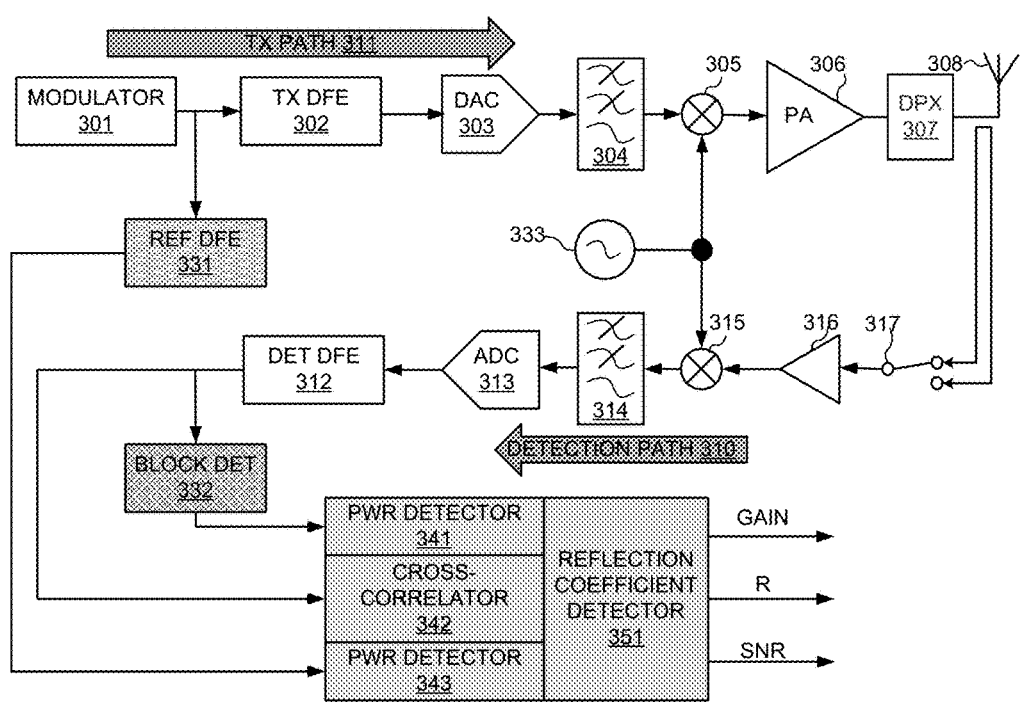
FIG. 4 illustrates an exemplary block diagram for the reflection coefficient estimation with matching circuit in accordance with embodiments of the current invention.

FIG. 4 illustrates an exemplary block diagram for the reflection coefficient estimation with matching circuit in accordance with embodiments of the current invention. The transmission unit of the apparatus includes a transmission path 311 and a detection path 310. Transmission path 311 includes a modulator 301, a transmission digital front end (DFE) unit 302, a DAC 303, a complimentary low pass filter 304, a mixer 305, an amplifier 306, a duplexer 307, and an antenna 308. The baseband signal is processed through transmission path 311 and sent out via antenna 308. FIG. 4 also includes a detection path 310. Detection path 310 includes a switch 317, which switches between the forward path and the reverse path. Switch 317 feeds in the forward path signal and the reverse path signal to detection path 310. Detection path 310 includes an amplifier 316, a mixer 315, a low pass filter 314, an ADC 313, and detection path DFE 312. In one embodiment, a block detector 332 is used to block lower range or higher range signals. Detection path 310 takes the measurement signals, including the forward path signal and the reverse path signal from the coupler of antenna 308 and feeds the digital detection signal to a reflection coefficient estimator. In one novel aspect, the reflection coefficient estimator is a mix of hardware and software.

In novel aspect, a reference signal DFE 331 directly takes modulated signal from modulator 301. The modulated signal is any on-the-fly modulated signal of the operating apparatus. The reflection coefficient is estimated using the regular operating signal as the reference signal without interrupting the operation. The reference signal, the detection signals from detection DFE 312 and block detector 332 are passed to the reflection coefficient estimator. The reference DFE 331 includes a matching circuit that aligns the reference signal and the detection signal such that the modulation signal influence/interference are removed.

In one embodiment, the estimator includes two power detectors 341, 343, and a cross-correlator 342. Cross-correlator 342 receives detection signals including the forward path signal and the reverse path signal, and the reference signal. When the detection signal and the reference signal are aligned, which means the reference signal and the detection signal has the same phase shift, the modulation interference is eliminated. The phase of the coupling gain can be obtained from the result of the cross-correlation. By aligning the reference signal with the detection signal, the amplitude and the phase of the reflection coefficient is obtained using the two power detectors and a cross-correlator. The outputs of power detectors 341, 343, and a cross-correlator 342 are passed to a reflection coefficient detector 351. Reflection coefficient detector 351 obtains the phase reflection coefficient and the amplitude/magnitude based on its inputs. The phase of the reflection coefficient is obtained based on the cross-correlation value ($CR_{for}$) of the forward path signal with the reference signal; and the cross-correlation value ($CR_{rev}$) of the reverse path signal with the reference signal. More particularly, the phase of the reflection coefficient is obtained by calculating the phase difference of $CR_{rev}$ and $CR_{for}$. The amplitude of the reflection coefficient is obtained based on a detection signal power for reverse coupling gain, a reference signal power for reverse coupling gain, a detection signal power for forward coupling gain, and a reference signal power for forward coupling gain.

In one novel aspect, the detection DFE 312 is not limited to any kinds of filters. The important step is to have matching reference signal and detection signal. The signals are matching if both signals have the same sampling rate, the same frequency offset, the same timing lag, and the same spectrum response. In one embodiment, the reference path uses a five taps symmetric FIR filter such that the reference signal matches with detection signal. The power detectors and the cross-correlator are implemented by the hardware. These sub functions are working in sample base. The function of arctangent and square root are implemented by the software to estimate the reflection coefficient. These sub functions are working in time base (one time per estimation).

Figure 5:
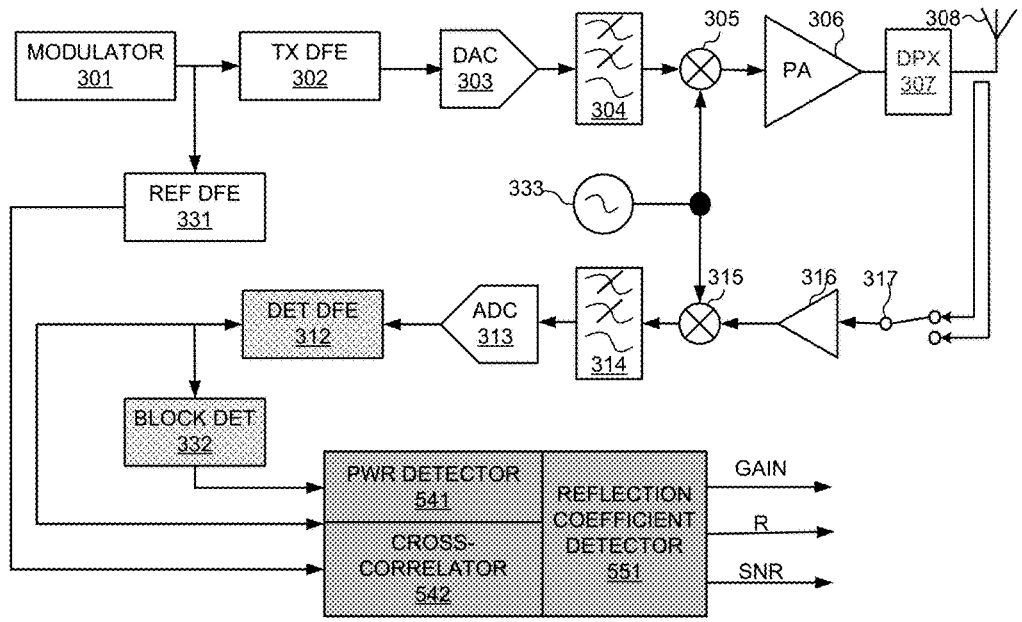
FIG. 5 illustrates an exemplary block diagram for the reflection coefficient estimation with matching circuit using one power detector and one cross-correlation in accordance with embodiments of the current invention.

FIG. 5 illustrates an exemplary block diagram for the reflection coefficient estimation with matching circuit using one power detector and one cross-correlation in accordance with embodiments of the current invention. In one embodiment, the reflection coefficient estimation uses one power detector and one cross-correlation. The transmission unit includes a transmission path and a detection path the same as shown in FIG. 4. A reflection coefficient estimator receives a reference signal from a reference DFE 331, detection signals from a detection DEF 312, and a block detector 332. The reference signal received is any regular signal used in the wireless system. A power detector 541 and a cross-correlator 542 process the received input and passes to a reflection coefficient detector 551 to obtain the reflection coefficient. The reference signal and the detection signals are aligned using a matching circuit. The aligned signal removes the modulation signal influence. Therefore, the forward path gain is the cross-correlation value of the forward path signal and the reference signal over the reference signal power for forward coupling gain. Similarly, the reverse path gain is the cross-correlation value of the reverse path signal and the reference signal over the reference signal power for reverse coupling gain. The reflection coefficient is obtained based on the calculated forward gain and the reverse path gain and equals to the reverse path gain over the forward path gain.

In the embodiment illustrated in FIG. 5, the new estimator method avoids using the power detector of the detection path. The effect of the DC and noise of the detection path is reduced. It also results in lower cost and lower power consumption.

Figure 6:
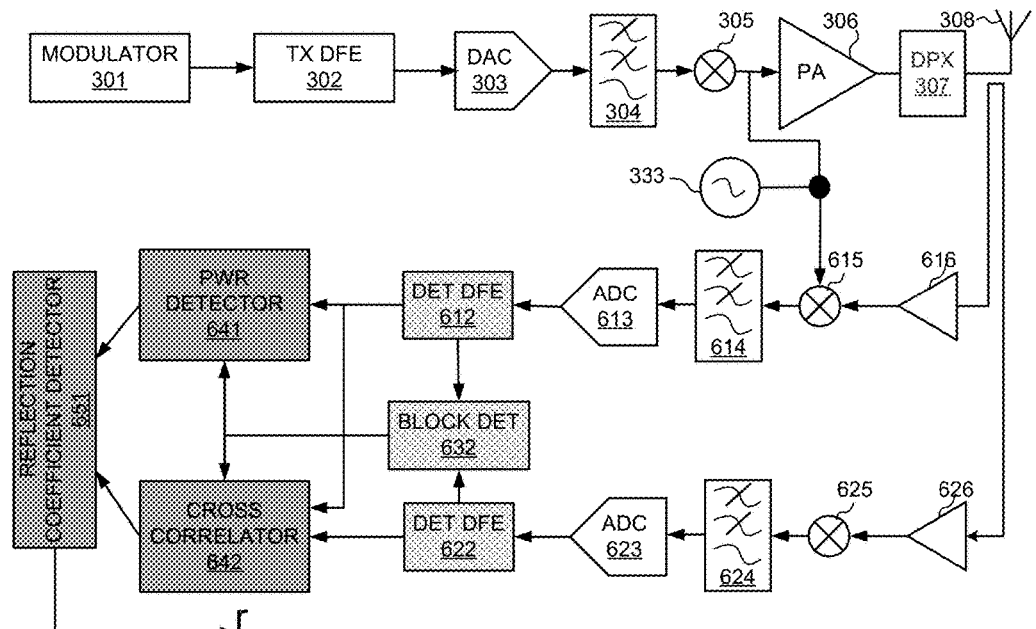
FIG. 6 illustrates an exemplary block diagram for the reflection coefficient estimation with two measurement paths in accordance with embodiments of the current invention.

FIG. 6 illustrates an exemplary block diagram for the reflection coefficient estimation with two measurement paths in accordance with embodiments of the current invention. The transmission unit includes the same transmission path as in FIG. 4. In one embodiment, two measurement paths, the forward measurement path and the reverse measurement path, are used for the reflection coefficient estimation. The reverse path and the forward path should have same response to remove the interference signal (e.g., transmitted modulation signal). The forward measurement path includes an amplifier 616, a mixer 615, a low pass filter 614, an ADC 613, and detection path DFE 612. The reverse measurement path includes an amplifier 626, a mixer 625, a low pass filter 624, an ADC 623, and detection path DFE 622. In one embodiment, a block detector 632 is used to block lower range or higher range signals. A power detector 641 and a cross-correlator 642 are used to calculate power and cross-correlation values based on the received forward path signal and the reverse path signal. A reflection coefficient detector 651 is used to obtain the reflection coefficient based on the power and the cross-correlation values. In one embodiment, since there are two measurement paths, the reflection coefficient equals to the cross-correlation value of the forward path signal and the reverse path signal over the forward path power value.

Figure 7:
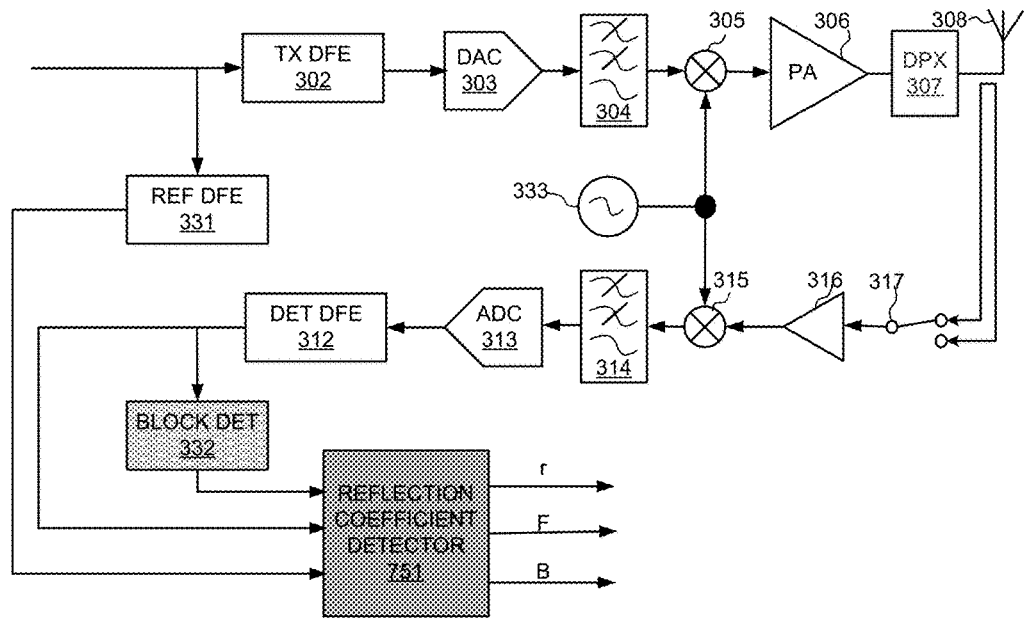
FIG. 7 illustrates an exemplary block diagram for the reflection coefficient estimation with fractional timing mismatch method in accordance with embodiments of the current invention.

FIG. 7 illustrates an exemplary block diagram for the reflection coefficient estimation with fractional timing mismatch method in accordance with embodiments of the current invention. Similar to FIG. 4, the transmission unit includes the transmission path and the detection path. A reflection coefficient detector 751 is used to estimate the reflection coefficient based on the reference signal from reference DFE 331, and detection signals from detection DFE 312, block detector 332. In one embodiment, the reference signal is a known signal. A coarse alignment of the reference signal and the detection signals are performed such that the time difference is a fraction and the sample interval T is less than half of the symbol interval to satisfy the Nyquist sampling theory. The reflection coefficient is the ratio of the reverse cross-correlation and the forward cross-correlation. The timing mismatch does not matter in obtaining the reflection coefficient as long as the reference signal is stationary. However, using the forward path measurement only, the forward path gain cannot be obtained. To obtain the forward path gain, fractional time estimation is required. In one embodiment, the timing interpolation function, such as sinc, is known. Reflection coefficient detector 751 obtains a forward path gain and a reverse path gain with a number of sampling greater than a sampling threshold. The sampling threshold is programmable. Since the timing interpolation function is known, the timing offset value is estimated and the forward path gain is obtained.

Figure 8:
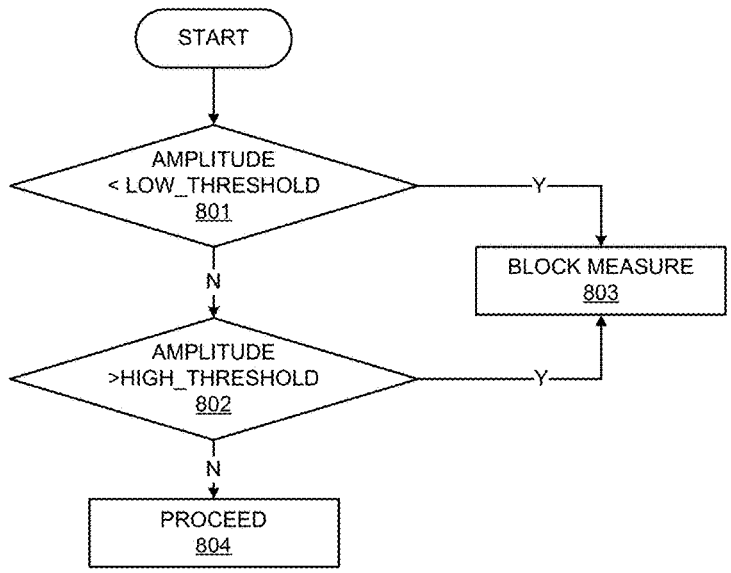
FIG. 8 illustrates an exemplary flow chart for the block detector in accordance with embodiments of the current invention.

FIG. 8 illustrates an exemplary flow chart for the block detector in accordance with embodiments of the current invention. In embodiments of the current invention, block detectors are used to detect low amplitude range or higher range to block the measurement functions. At step 801, the apparatus determines whether the amplitude is smaller than a low-threshold value. If step 801 determines yes, the apparatus moves to step 803 and blocks the measurement function. If step 801 determines no, the apparatus moves to step 802 and determines whether the amplitude is greater than a high-threshold value. If step 802 determines yes, the apparatus moves to step 803 and blocks the measurement function. If step 802 determines no, the apparatus moves to step 804 to proceed with the measurement function.

Figure 9:
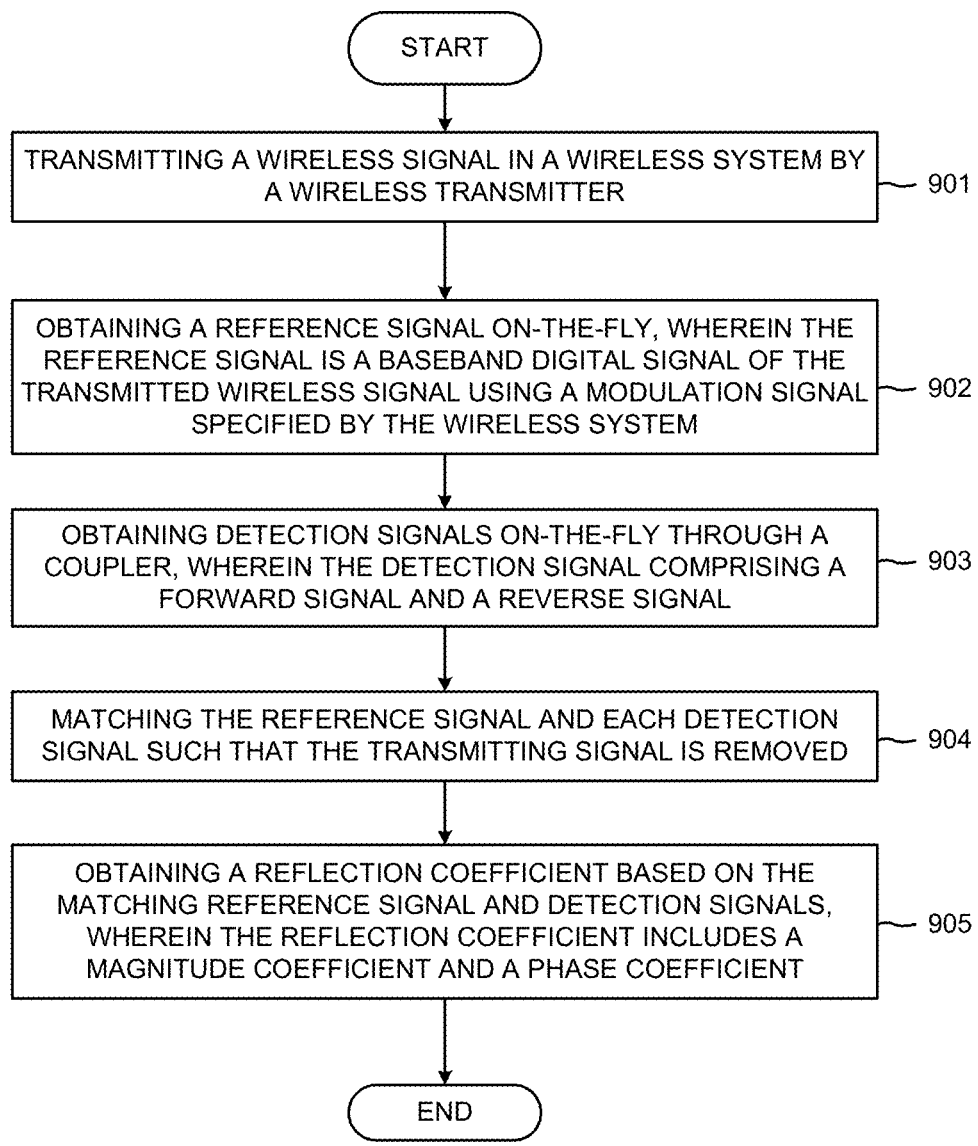
FIG. 9 illustrates an exemplary flow chart of the reflection coefficient estimation in accordance with embodiments of the current invention.

FIG. 9 illustrates an exemplary flow chart of the reflection coefficient estimation in accordance with embodiments of the current invention. At step 901, the apparatus transmits a wireless signal in a wireless system. At step 902, the apparatus obtains a reference signal on-the-fly, wherein the reference signal is a baseband digital signal of the transmitted wireless signal using a modulation signal specified by the wireless system. At step 903, the apparatus obtains detection signals on-the-fly through a coupler, wherein the detection signal comprising a forward signal and a reverse signal. At step 904, the apparatus matches the reference signal and each detection signal such that the transmitting signal is removed. At step 905, the apparatus obtains a reflection coefficient based on the matching reference signal and detection signals, wherein the reflection coefficient includes a magnitude coefficient and a phase coefficient.

Although the present invention has been described in connection with certain specific embodiments for instructional purposes, the present invention is not limited thereto. Accordingly, various modifications, adaptations, and combinations of various features of the described embodiments can be practiced without departing from the scope of the invention as set forth in the claims.

What is claimed is:

1. A method comprising:
   transmitting a wireless signal by a wireless transmitter;
   obtaining detection signals on-the-fly through a coupler, wherein the detection signals comprising a forward signal and a reverse signal;
   obtaining a reference signal on-the-fly, wherein the reference signal corresponds to a modulation signal; and
   obtaining a reflection coefficient based on at least the detection signals and the reference signal, wherein the reflection coefficient includes a magnitude coefficient and a phase coefficient.

2. The method of claim 1, further comprising:
   matching the reference signal and each detection signal such that an interference caused by transmitting signal is reduced.

3. The method of claim 2, wherein the reflection coefficient is based on a cross-correlation of the reverse signal and the reference signal, a reference signal power for forward coupling gain, a cross-correlation of the forward signal and the reference signal, and a reference signal power for reverse coupling gain.

4. The method of claim 1, wherein obtaining the reflection coefficient involves:
   obtaining a magnitude coefficient; and
   obtaining a phase coefficient.

5. The method of claim 4, wherein the phase coefficient is based on a cross-correlation of the forward signal and the reference signal, and a cross-correlation of the reverse signal and the reference signal.

6. The method of claim 1, wherein obtaining the reflection coefficient involves:
   obtaining a power magnitude for the forward signal;
   obtaining a cross-correlation of the reverse signal and the forward signal; and
   obtaining the reflection coefficient based on the power magnitude for the forward signal and the cross-correlation of the reverse signal and the forward signal.

7. The method of claim 1, wherein obtaining the reflection coefficient involves:
   obtaining a forward path gain and a reverse path gain with a number of sampling greater than a sampling threshold; and
   obtaining the reflection coefficient based on the forward path gain and the reverse path gain.

8. The method of claim 1, further comprising:
   detecting one or more out-of-range conditions, wherein the out-of-range condition is detected if an amplitude of a detection signal is smaller than a low-threshold or greater than a high-threshold; and
   blocking signal measurements if an out-of-range condition is detected.

9. A method comprising:
   transmitting a wireless signal by a wireless transmitter;
   obtaining detection signals through a coupler, wherein the detection signals comprising a forward signal and a reverse signal; and
   obtaining a reflection coefficient based on at least the detection signals, wherein the reflection coefficient includes a magnitude coefficient and a phase coefficient, wherein obtaining the reflection coefficient involves:
   obtaining a power magnitude for the forward signal or the reverse signal;
   obtaining a cross-correlation of the reverse signal and the forward signal; and
   obtaining the reflection coefficient based on the power magnitude and the cross-correlation.

10. A method comprising:
    transmitting a wireless signal by a wireless transmitter;
    obtaining detection signals through a coupler, wherein the detection signals comprising a forward signal and a reverse signal; and
    obtaining a reflection coefficient based on at least the detection signals, wherein the reflection coefficient includes a magnitude coefficient and a phase coefficient, wherein obtaining the reflection coefficient involves:
    obtaining a forward path gain and a reverse path gain with a number of sampling greater than a sampling threshold; and
    obtaining the reflection coefficient based on the forward path gain and the reverse path gain.

11. An apparatus, comprising:
    a wireless radio frequency (RF) transceiver that transmits a wireless signal specified in a wireless standard;
    a detector that measures a forward signal and a reverse signal;
    a reflection coefficient estimator that obtains a reflection coefficient based on at least the forward and reverse signals, wherein the reflection coefficient includes a magnitude coefficient and a phase coefficient; and
    a matching circuit that matches a reference signal and each forward and reverse signal such that an interference caused by the transmitted wireless signal is reduced, wherein the reference signal is a modulation signal of transmitted signal.

12. An apparatus, comprising:
    a wireless radio frequency (RF) transceiver that transmits a wireless signal specified in a wireless standard;
    a detector that measures a forward signal and a reverse signal; and
    a reflection coefficient estimator that obtains a reflection coefficient based on at least the forward and reverse signals, wherein the reflection coefficient includes a magnitude coefficient and a phase coefficient, wherein the reflection coefficient estimator comprises a power detector and a cross-correlator.

* * * * *